(12) United States Patent
Lee et al.

(10) Patent No.: US 12,125,550 B2
(45) Date of Patent: Oct. 22, 2024

(54) MEMORY DEVICE, MEMORY SYSTEM INCLUDING THE MEMORY DEVICE, AND TEST OPERATION OF THE MEMORY DEVICE

(71) Applicant: SK hynix Inc., Icheon-si (KR)

(72) Inventors: Jun Hyuk Lee, Icheon-si (KR); Deung Kak Yoo, Icheon-si (KR); Dong Jae Jung, Icheon-si (KR); Min Kyu Lee, Icheon-si (KR)

(73) Assignee: SK hynix Inc., Icheon-si (KR)

(*) Notice: Subject to any disclaimer, the term of this patent is extended or adjusted under 35 U.S.C. 154(b) by 356 days.

(21) Appl. No.: 17/502,561

(22) Filed: Oct. 15, 2021

(65) Prior Publication Data
US 2022/0336040 A1 Oct. 20, 2022

(30) Foreign Application Priority Data

Apr. 20, 2021 (KR) .................. 10-2021-0051250

(51) Int. Cl.
*G11C 29/00* (2006.01)
*G11C 16/04* (2006.01)
*G11C 16/24* (2006.01)
*G11C 29/50* (2006.01)

(52) U.S. Cl.
CPC .... *G11C 29/50004* (2013.01); *G11C 16/0483* (2013.01); *G11C 16/24* (2013.01); *G11C 2029/5004* (2013.01)

(58) Field of Classification Search
CPC .......... G11C 29/50004; G11C 16/0483; G11C 16/24; G11C 2029/5004
See application file for complete search history.

(56) References Cited

U.S. PATENT DOCUMENTS

| 9,711,197 B1* | 7/2017 | Kim ................. G11C 16/10 |
| 2012/0008416 A1* | 1/2012 | Cho .................. G11C 29/50 |
| | | 365/185.25 |
| 2022/0051714 A1* | 2/2022 | Bang ............... G11C 16/3418 |

FOREIGN PATENT DOCUMENTS

| KR | 101462605 B1 | 11/2014 |
| KR | 1020170015707 A | 2/2017 |

* cited by examiner

*Primary Examiner* — Christine T. Tu
(74) *Attorney, Agent, or Firm* — WILLIAM PARK & ASSOCIATES LTD.

(57) ABSTRACT

The present technology includes a memory device, a memory system including the memory device, and a test operation of the memory device. The memory device includes a memory block connected to word lines and select lines, a bit line connected to the memory block, a voltage generator configured to generate a test voltage to be applied to a selected line among the word lines and the select lines, a page buffer configured to sense a voltage of the bit line to store and output test data, and a control logic circuit configured to determine whether a first defect exists in the memory block according to the test data.

12 Claims, 13 Drawing Sheets

MEMORY DEVICE, MEMORY SYSTEM INCLUDING THE MEMORY DEVICE, AND TEST OPERATION OF THE MEMORY DEVICE

CROSS-REFERENCE TO RELATED APPLICATION

The present application claims priority under 35 U.S.C. § 119(a) to Korean patent application number 10-2021-0051250 filed on Apr. 20, 2021, in the Korean Intellectual Property Office, the entire disclosure of which is incorporated by reference herein.

BACKGROUND

1. Technical Field

The present disclosure relates to a memory device, a memory system including the memory device, and a test operation of the memory device, and more particularly, to a memory device configured to test a defect of a memory device included in a memory system, the memory system including the memory device, and a test operation of the memory device.

2. Related Art

A memory system may include a memory device configured to store data and a controller configured to control the memory device.

The memory device may include a memory block in which data is stored and peripheral circuits configured to perform a program, read, or erase operation. The memory block may include a plurality of strings connected between bit lines and a source line, and the plurality of strings may include memory cells capable of storing data. The plurality of memory cells may be programmed, read, or erased according to voltages applied to word lines and bit lines.

As a storage capacity of the memory system increases and an integration degree increases, a size and a distance of the memory cells included in the memory device decrease. As the size and the distance of the memory cells decrease, a size of a line connected to the memory cells decreases, and thus a short defect or an open defect may occur in a manufacturing step of the memory device. The short defect means a defect in which elements that are required to electrically separated from each other are connected to each other, and the open defect means a defect in which elements that are required to be electrically connected to each other are separated from each other.

SUMMARY

According to an embodiment of the present disclosure, a memory device may include a memory block connected to word lines and select lines, a bit line connected to the memory block, a voltage generator configured to generate a test voltage to be applied to a selected line among the word lines and the select lines, a page buffer configured to sense a voltage of the bit line to store and output test data, and a control logic circuit configured to determine whether a first defect exists in the memory block according to the test data. The page buffer includes a sensing latch configured to store the test data determined according to a voltage of a sensing node during a test operation for detecting the first defect of the memory block, a sensing discharge circuit configured to discharge the sensing node, and a bit line select circuit configured to block a connection between the sensing node and the bit line, when determining the test data according to the voltage of the sensing node. The test data is maintained as reset data in the sensing latch when the test operation is started and the first defect does not exist in the memory block, and is changed when the first defect exists in the memory block.

According to an embodiment of the present disclosure, a memory system may include a memory device including a page buffer connected to a memory block through bit lines, and a controller configured to transmit a test command to the memory device and determine whether a defect exists based on test data output from the memory device, during a test operation for detecting the defect of the memory block. The memory device is configured to store initial data in a sensing latch of the page buffer in response to the test command, discharge a sensing node connected between the hit line and the sensing latch, store the test data in the sensing latch according to a voltage of the sensing node changed by the test operation, and output the test data to the controller. The controller is configured to determine that a first defect occurs in the memory block when the test data is different from the initial data.

According to an embodiment of the present disclosure, a method of performing a test operation on a memory device may be provided. The method may include resetting a sensing latch, discharging a sensing node connected between the sensing latch and a bit line, applying a test voltage to a selected line among word lines and select lines in a memory block connected to the bit line, transmitting a voltage of the bit line to the sensing node, and storing the test voltage in the sensing latch according to a voltage of the sensing node.

DETAILED DESCRIPTION

Specific structural or functional descriptions of embodiments according to the concepts which are disclosed in the present specification or application are illustrated only to describe the embodiments according to the concepts of the present disclosure. The embodiments according to the concepts of the present disclosure may be carried out in various forms and should not be construed as being limited to the embodiments described in the present specification or application.

An embodiment of the present disclosure provides a memory device capable of detecting a short defect among defects occurring in the memory device, a memory system including the same, and a test operation of the memory device.

According to the present technology, a short defect among defects that may occur in a memory device may be detected.

Figure 1:
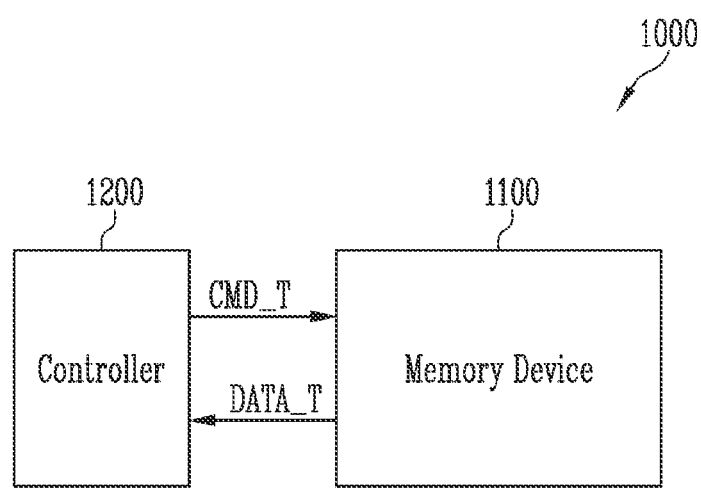
FIG. 1 is a diagram illustrating a memory system according to an embodiment of the present disclosure.

FIG. 1 is a diagram illustrating a memory system according to an embodiment of the present disclosure.

Referring to FIG. 1, the memory system 1000 may be configured to store, erase, or output data in response to a request of a host. For example, the memory system 1000 may include a memory device 1100 capable of storing data, and a controller 1200 capable of communicating between the host and the memory device 1100. Although the memory system 1000 including one memory device 1100 is shown in FIG. 1, two or more memory devices may be included in the memory system 1000.

When the request is received from the host, the controller 1200 may generate a command for controlling the memory device 1100 according to the received request. The controller 1200 may be configured to manage a logical address used in the host and a physical address used in the memory device 1100. For example, during a program operation, the controller 1200 may map the logical address used in the host and the physical address used in the memory device 1100 to each other. During a read operation, the controller 1200 may search for the physical address mapped to the logical address requested by the host and output data read according to the physical address to the host.

The controller 1200 according to the present embodiment may be configured to transmit a test command CMD_T to the memory device 1100 and determine whether a short defect exists based on test data DATA_T output from the memory device 1100 during a test operation of the memory device 1100.

The controller 1200 may perform the test operation when a test request is received from the host, but may perform the test operation when performing a background operation even though the request of the host does not exist.

Figure 2:
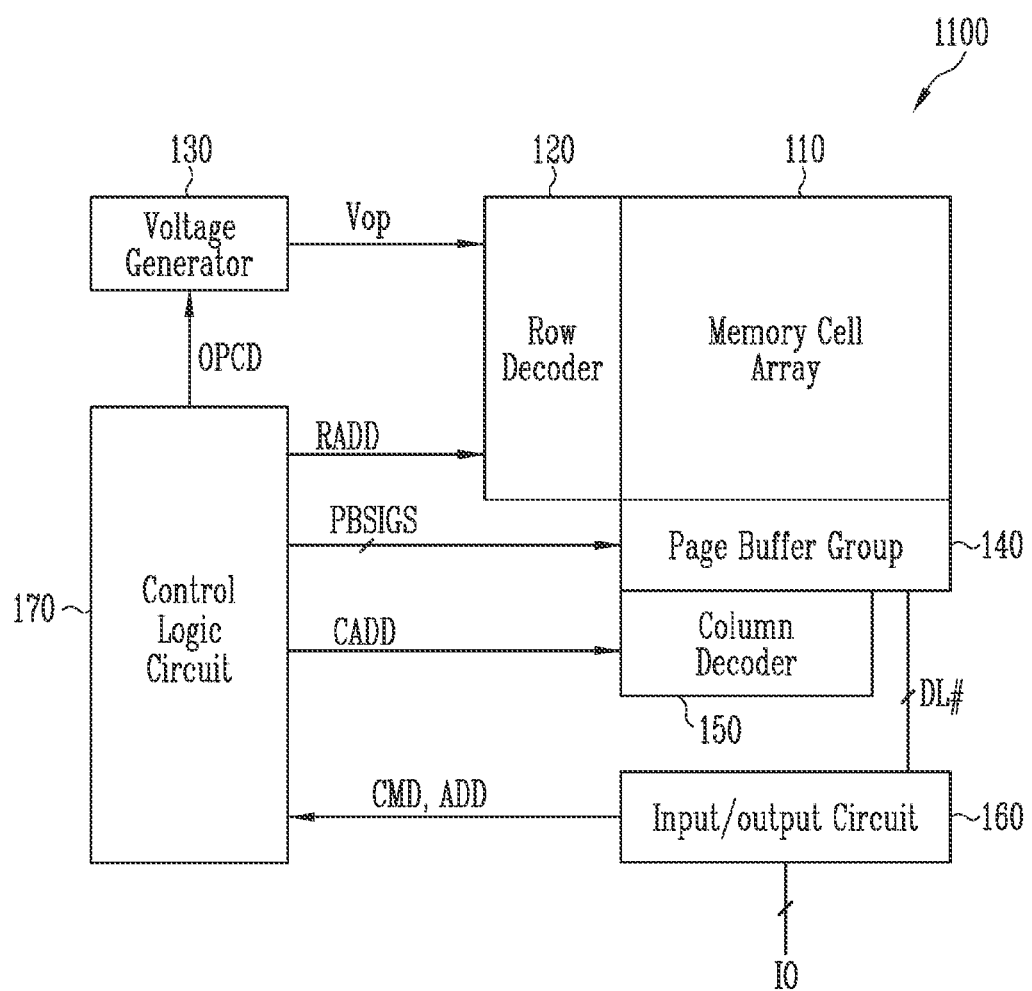
FIG. 2 is a diagram illustrating a memory device.

FIG. 2 is a diagram illustrating the memory device.

Referring to FIG. 2, the memory device 1100 may include a memory cell array 110 in which data is stored, and peripheral circuits 120 to 170 capable of performing a program, read, or erase operation.

The memory cell array 110 may include a plurality of memory blocks in which data is stored. Each of the memory blocks includes a plurality of memory cells, and the plurality of memory cells may be implemented in a two-dimensional structure in which the memory cells are arranged on a substrate in parallel or a three-dimensional structure in which the memory cells are stacked on the substrate in a vertical direction.

The peripheral circuits 120 to 170 may include a row decoder 120, a voltage generator 130, a page buffer group 140, a column decoder 150, and an input/output circuit 160, and a control logic circuit 170.

The row decoder 120 may select one memory block from among the memory blocks included in the memory cell array 110 according to a row address RADD, and transmit operation voltages Vop to the selected memory block.

The voltage generator 130 may generate and output the operation voltages Vop required for various operations, in response to an operation code OPCD. For example, the voltage generator 130 may generate a test voltage, a program voltage, a read voltage, an erase voltage, a pass voltage, a verify voltage, a negative voltage, and the like in response to the operation code OPCD, and selectively output the generated voltages.

The page buffer group 140 may be connected to the memory cell array 110 through bit lines. For example, the page buffer group 140 may include page buffers connected to each of the bit lines. The page buffers may operate simultaneously in response to page buffer control signals PBSIG, and may temporarily store data during the program or read operation. During the read operation or a verify operation, the page buffers may sense a voltage of the bit lines, which varies according to a threshold voltage of the memory cells. That is, it may be determined whether the threshold voltages of the memory cells are lower or higher than the read voltage or the verify voltage, according to a result of a sensing operation performed in the page buffers. In an embodiment of the present disclosure, the page buffers may sense the voltage of the bit lines, and maintain data stored in a latch as initial data or change the data stored in the latch according to the sensed voltage. The words "simultaneous" and "simultaneously" as used herein with respect to processes mean that the processes take place on overlapping intervals of time. For example, if a first process takes place over a first interval of time and a second process takes place simultaneously over a second interval of time, then the first and second intervals at least partially overlap each other such that there exists a time at which the first and second processes are both taking place.

The column decoder 150 may transmit data through data lines DL connecting the input/output circuit 160 and the page buffer group 140 according to a column address CADD.

The input/output circuit 160 may be connected to the controller 1200 of FIG. 1 through input/output lines IO. The input/output circuit 160 may input/output a command CMD, an address ADD, and the data through the input/output lines TO. For example, the input/output circuit 160 may transmit the command CMD and the address ADD received from the controller 1200 through the input/output lines IO to the control logic circuit 170, and transmit the data received from the controller 1200 through the input/output lines IO to the page buffer group 140, The input/output circuit 160 may output the data received from the page buffer group 140 to the controller 1200 through the input/output lines IO. According to the present embodiment, test data output from the page buffer group 140 during the test operation may be output to the controller 1200 through the input/output circuit 160.

The control logic circuit 170 may output the operation code OPCD, the row address RADD, the page buffer control signals PBSIG, and the column address CADD in response to the command CMD and the address ADD. For example, the control logic circuit 170 may include software that performs an algorithm in response to the command CMD, and hardware configured to output various signals according to the address ADD and the algorithm. The control logic circuit 170 may control the row decoder 120, the voltage generator 130, the page buffer group 140, and the column decoder 150 to perform the test operation according to the test command. During the test operation, the control logic circuit 170 may determine whether a selected memory block is defective according to the test data read from the memory cell array 110.

Figure 3:
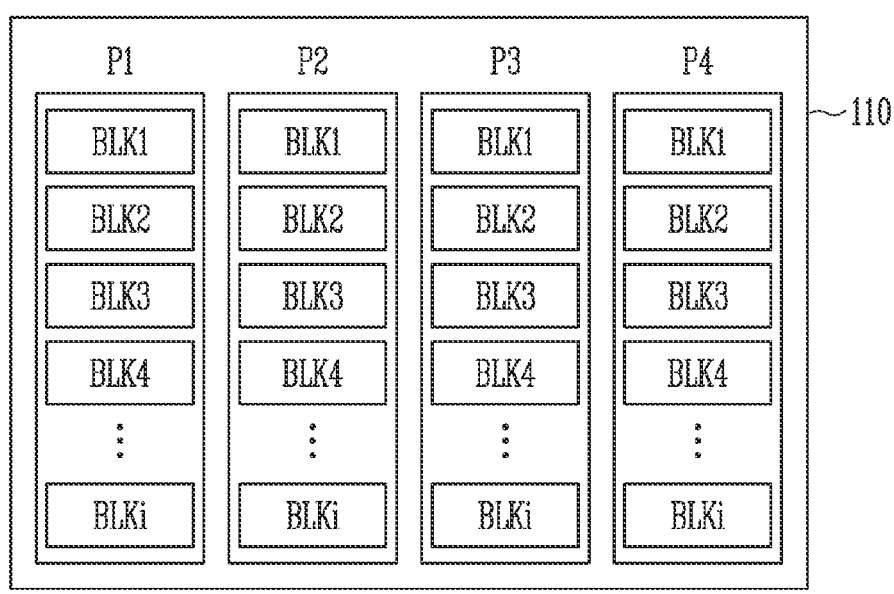
FIG. 3 is a diagram illustrating a memory cell array.

FIG. 3 is a diagram illustrating the memory cell array.

Referring to FIG. 3, the memory cell array 110 may be configured as a single plane or a multi plane. The single plane refers to a configuration in which only one plane is included in the memory cell array 110, and the multi plane refers to a configuration in which a plurality of planes are included in the memory cell array 110. FIG. 3 shows the memory cell array 110 configured as the multi plane. For example, first to fourth planes P1 to P4 may be included in the memory cell array 110. The first to fourth planes P1 to P4 may be defined as a memory region in which different row decoders and different page buffer groups are connected. Each of the first to fourth planes P1 to P4 may include first to i-th memory blocks BLK1 to BLKi (i is a positive integer). The first to i-th memory blocks BLK1 to BLKi included in different planes may be connected to different row decoders and different page buffer groups, and the first to i-th memory blocks BLK1 to BLKi included in the same plane may be connected to the same row decoder and the same page buffer group. The first to i-th memory blocks BLK1 to BLKi may be configured in the same structure.

Figure 4:
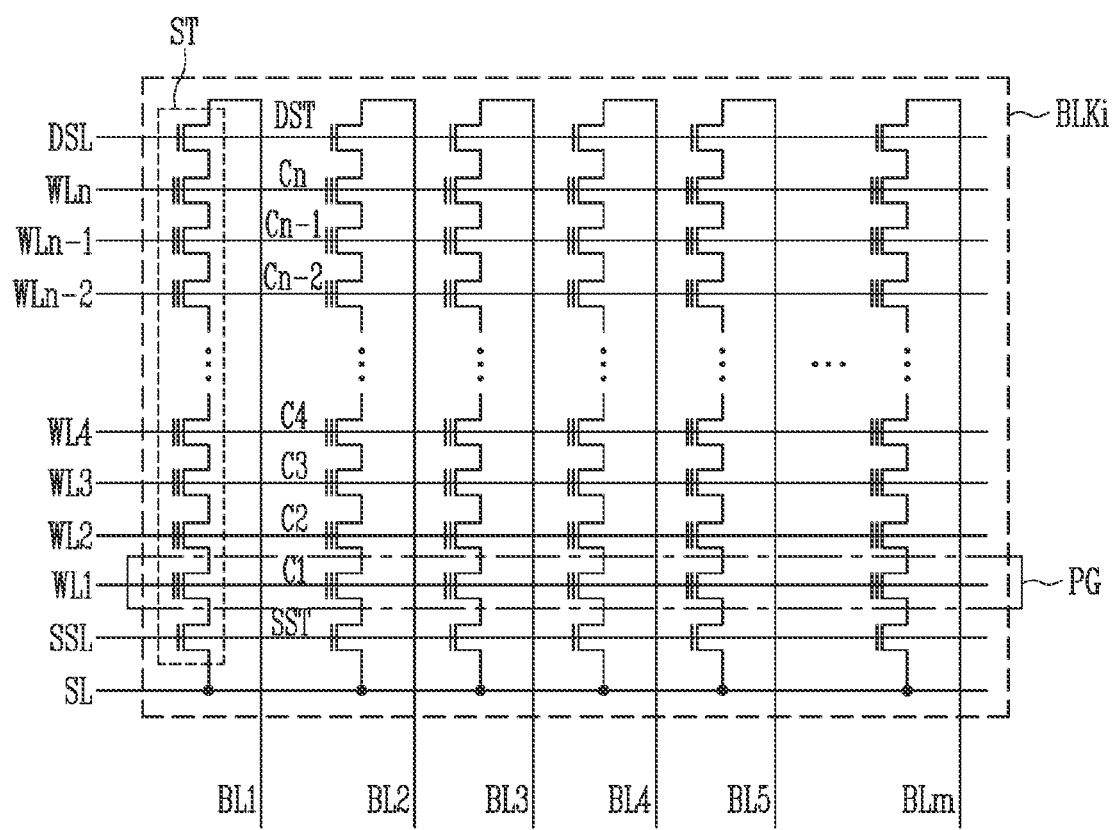
FIG. 4 is a diagram illustrating a memory block.

FIG. 4 is a diagram illustrating the memory block.

Referring to FIG. 4, any one memory block BLKi among the plurality of memory blocks BLK1 to BLKi shown in FIG. 3 is shown as an embodiment.

The memory block BLKi may include a plurality of strings ST connected between first to m-th bit lines BL1 to BLm and a source line SL. Each of the strings ST may include a source select transistor SST, first to n-th memories cells C1 to Cn, and a drain select transistor DST connected in series between the source line SL and the first to m-th bit lines BL1 to BLm (m is a positive integer).

Since the memory block BLKi shown in FIG. 4 is a diagram illustrating a configuration of the memory block, the number of source select transistors SST, first to n-th memory cells C1 to Cn, and drain select transistors DST is not limited to the number shown in FIG. 4.

Gates of the source select transistors SST connected to different strings ST may be connected to a source select line SSL, gates of each of the first to n-th memory cells C1 to Cn may be connected to first to n-th the word lines WL1 to WLn, and gates of the drain select transistors DST may be connected to a drain select line DSL.

A group of memory cells connected to the same word line and included in different strings ST may constitute one page PG. The program operation and the read operation may be performed in a unit of the page PG. In the test operation according to the present embodiment, the pages PG may be selected one by one, or a plurality of pages PG may be simultaneously selected.

The memory cells included in the memory block BLKi may be variously programmed according to a program method. For example, the program operation may be performed in a single level cell (SLC) method, a multi-level cell (MLC) method, a triple level cell (TLC) method, or a quadruple level cell (QLC) method. The SLC method is a method in which one bit of data is stored in one memory cell. The MLC method is a method in which two bits of data are stored in one memory cell. The TLC method is a method in which three bits of data are stored in one memory cell. The QLC method is a method in which four bits of data are stored in one memory cell. In addition, five or more bits of data may be stored in one memory cell.

Figure 5:
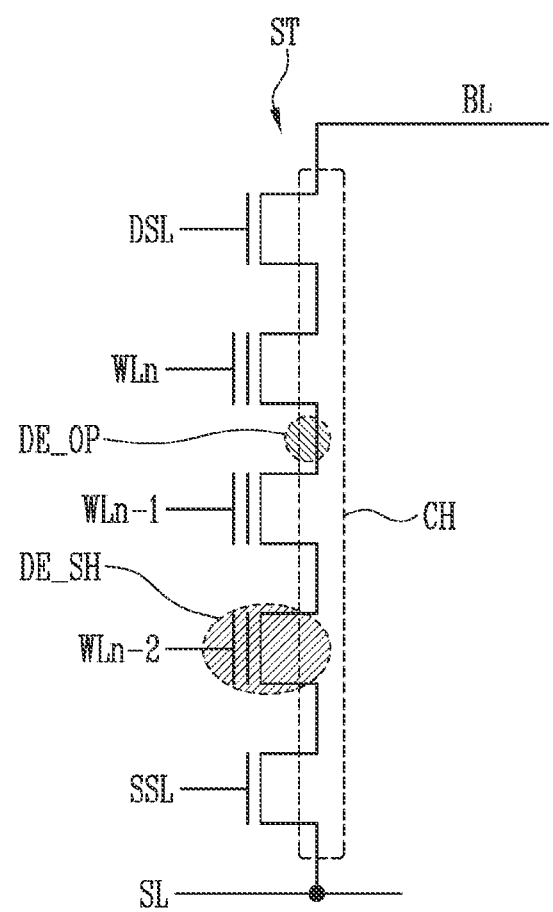
FIG. 5 is a diagram illustrating a defect occurring in the memory block.

FIG. 5 is a diagram illustrating a defect occurring in the memory block.

Referring to FIG. 5, a portion of a string ST is schematically shown. The string ST may include a plurality of memory cells, and the memory cells may be connected to different word lines WLn−2, WLn−1, and WLn.

When a defect occurs inside the string ST, a short defect DE_SH or an open defect DE_OP may occur. The short defect DE_SH may be a defect in which the word line and a channel CH are electrically connected to each other, and the open defect DE_OP may be a defect in which an electrically disconnected region occurs in the channel CH, That is, the short defect DE_SH is a defect in which elements that are required to be electrically disconnected from each other are connected to each other, and the open defect DE_OP is a defect in which elements that are required to be electrically connected to each other are disconnected from each other.

Assuming that the open defect DE_OP does not exist in the string ST, but the short defect DE_SH occurs in the memory cell to which the (n−2)-th word line WLn−2 is connected, during the program, read, or erase operation, a voltage applied to the (n−2)-th word line WLn−2 may be directly transmitted to the channel CH. In this case, since a voltage or a current of the bit line BL is changed, reliability of the program, read, or erase operation may be decreased.

Assuming that the short defect DE_SH does not exist M the string ST, but the open defect DE_OP occurs in the channel CH between the n-th and (n−1)-th word lines WLn and WLn−1, during the program, read, or erase operation, a voltage or a current of the bit line BL may be continuously maintained as an initial value regardless of the voltage applied to the word lines. In this case, since a state of the memory cells might not be sensed, the reliability of the program, read, or erase operation may be decreased.

Figure 6:
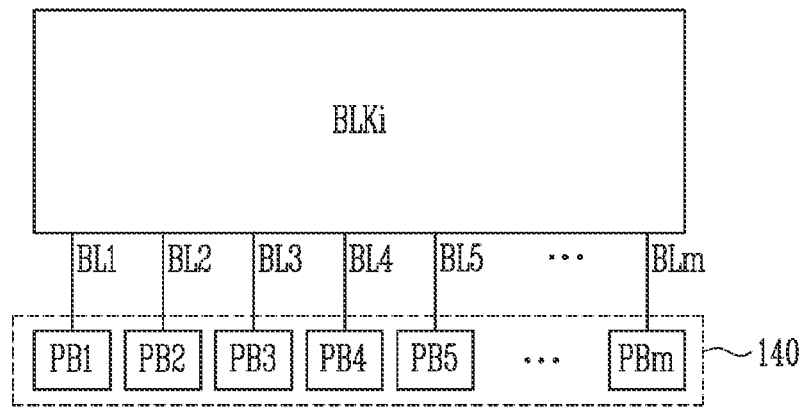
FIG. 6 is a diagram illustrating a connection configuration between a page buffer group and the memory block.

In the present embodiment, a method of detecting the short defect DE_SH is described, FIG. 6 is a diagram illustrating a connection configuration between the page buffer group and the memory block.

Referring to FIG. 6, the page buffer group 140 may include first to m-th page buffers PB 1 to PBm connected to first to m-th bit lines BL1 to BLm. Since the first to m-th page buffers PB1 to PBm respectively sense voltages of the first to m-th bit lines BL1 to BLm, the number of bit lines in which the short defect occurs may be counted during the test operation according to the present embodiment. That is, the number and a position of columns in which the short defect occurs may be detected from a result of the test operation.

Figure 7A:
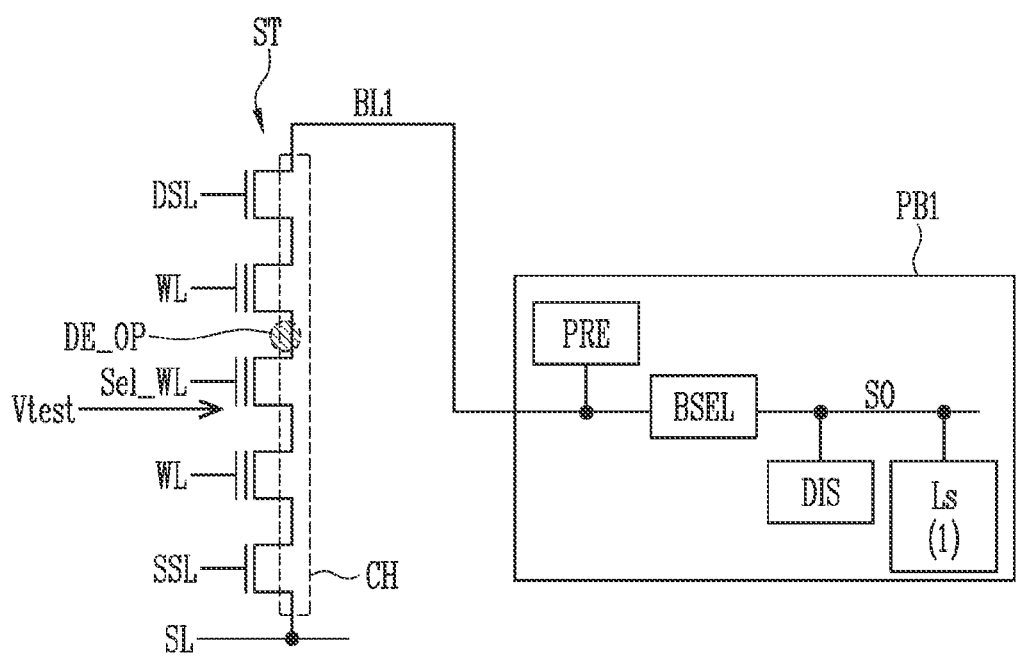
FIGS. 7A and 7B are diagrams illustrating a principle of a test operation according to an embodiment of the present disclosure.
Figure 7B:
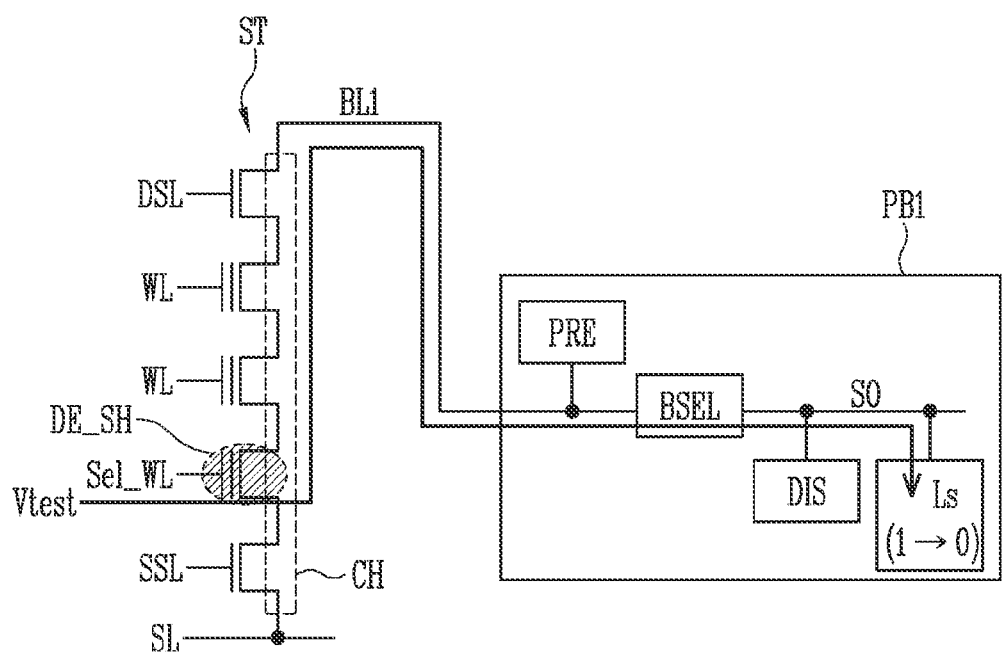

FIGS. 7A and 7B are diagrams illustrating a principle of a test operation according to an embodiment of the present disclosure, and a portion of the string ST connected to the first page buffer PB1 is shown as an example.

FIG. 7A is a diagram illustrating a case where a defect does not exist or the open defect DE_OP occurs in the string ST, and FIG. 7B is a diagram illustrating a case where the short defect DE_SH occurs in the string ST.

Referring to FIG. 7A, the first page buffer PB1 may include a precharge circuit PRE, a bit line select circuit BSEL, a discharge circuit DIS, and a sensing latch Ls connected around a sensing node SO. The precharge circuit PRE, the bit line select circuit BSEL, the discharge circuit DIS, and the sensing latch Ls may be used during the test operation. The precharge circuit PRE may be configured to precharge the first bit line BL1. The bit line select circuit BSEL may be configured to connect or disconnect the first bit line BL1 and the first page buffer PB1 to or from each other. The discharge circuit DIS may be configured to discharge the sensing node SO. For example, a voltage of the discharged sensing node SO may be 0V. The sensing latch Ls may be configured to store test data determined according to the voltage of the sensing node SO during the test operation.

During the test operation according to the present embodiment, the sensing node SO may be discharged and initialized to have 0V, and the first bit line BL1 and the sensing node SO may be connected to each other by the bit line select circuit BSEL, Therefore, the first bit line BL1 may also be discharged and initialized to have 0V. '1' data which is initial data may be stored in the sensing latch Ls. In the present embodiment, the initial data is set to '1', but the initial data may be set to be '0' according to the memory device. In an embodiment, resetting a sensing latch Ls may include storing initial data in the sensing latch.

As shown in FIG. 7A, in a case where the open defect DE_OP exists or the defect does not exist in the channel CH, when a test voltage Vtest of a positive voltage is applied to a selected word line Sel_WL, the test data of the sensing latch Ls may be maintained as data which is the initial data. The positive voltage is a voltage greater than zero. More specifically, even though the test voltage Vtest of the positive voltage is applied to the selected word line Sel_WL, since the test voltage Vtest is not transmitted to the first bit line BL1, a voltage of the first bit line BL1 is not increased. That is, since the voltage of the first bit line BL1 is maintained as 0V, the voltage of the sensing node SO may also be maintained as 0V, and thus data stored in the sensing latch Ls is not changed.

When the test data '1' stored in the sensing latch Ls is output to the controller 1200 of FIG. 1, the controller 1200 may determine that the defect does not exist or the open defect DE_OP exists in the string ST even though the defect exists in the string ST according to the '1' data.

Referring to FIG. 7B, in a case where the short defect DE_SH exists in the string ST, when the test voltage Vtest of the positive voltage is applied to the selected word line Sel_WL, the initial data 1 stored in the sensing latch Ls may be changed to '0' data. Alternatively, when the initial data is set to '0', the initial data '0' stored in the sensing latch Ls may be changed to '1' data. More specifically, when the test voltage Vtest of the positive voltage is applied to the selected word line Sel_WL, since the selected word line Sel_WL and the channel CH are electrically connected to each other due to the short defect DE_SH, the voltage of the first bit line BL1 may be increased. That is, since the voltage of the first bit line BL1 is increased to a positive voltage, the voltage of the sensing node SO may also be increased to a positive voltage, and thus the data stored in the sensing latch Ls is changed.

When the test data '0' stored in the sensing latch Ls output to the controller 1200 of FIG. 1, the controller 1200 may determine that the short defect DE_SH exists in the string ST according to the '0' data.

Figure 8:
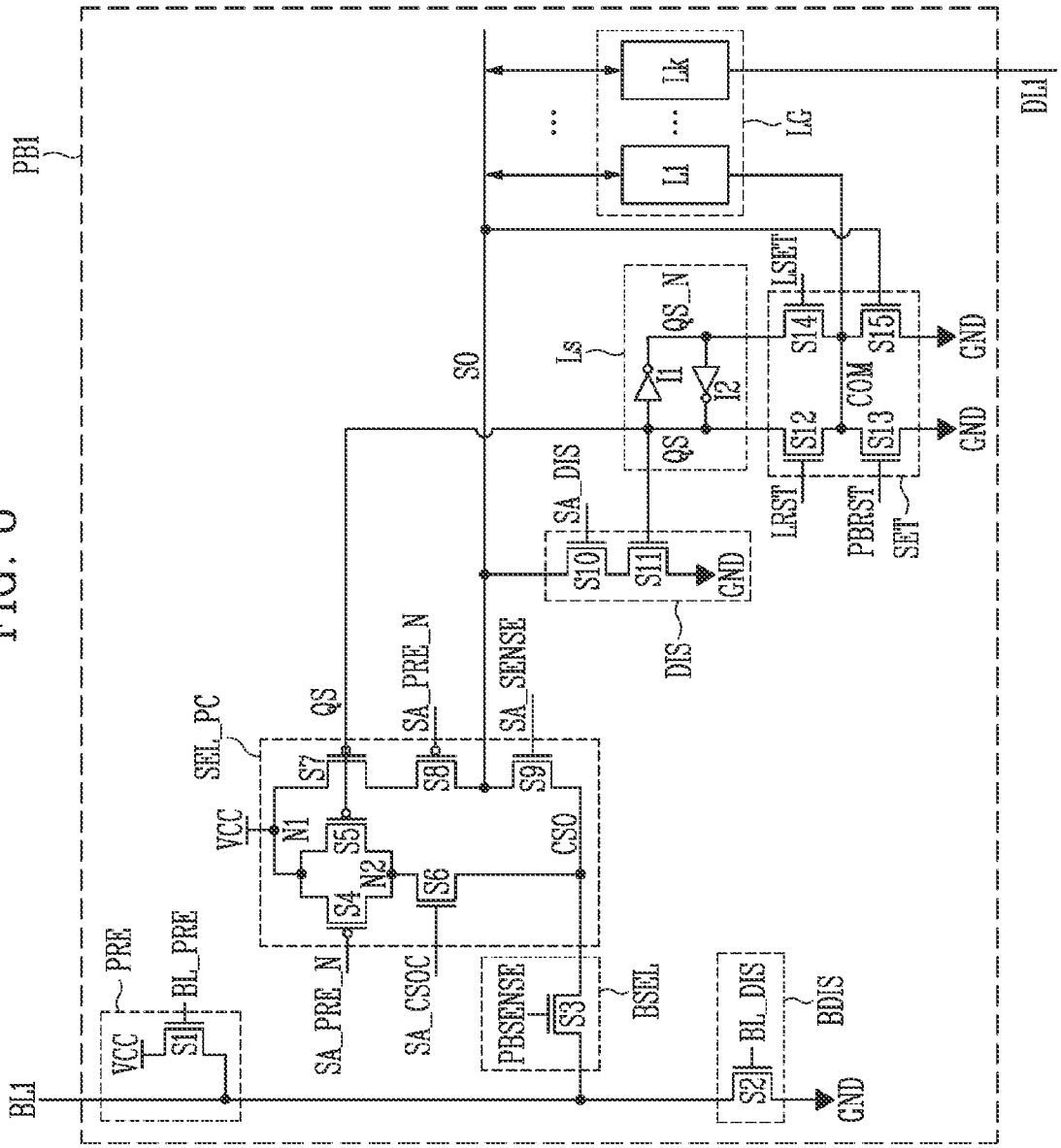
FIG. 8 is a circuit diagram illustrating a page buffer according to an embodiment of the present disclosure.

FIG. 8 is a circuit diagram illustrating a page buffer according to an embodiment of the present disclosure.

Since the plurality of page buffers are configured identically to each other, the first page buffer PB1 among the plurality of page buffers is shown in FIG. 8.

Referring to FIG. 8, the first page buffer PB1 may include a bit line precharge circuit PRE, a bit line discharge circuit BDIS, a bit line select circuit BSEL, a select precharge circuit SEL_PC, a sensing discharge circuit DIS, a sensing latch Ls, a setup circuit SET, and a latch group LG. The bit line precharge circuit PRE, the bit line discharge circuit BDIS, the bit line select circuit BSEL, the select precharge circuit SEL_PC, the sensing discharge circuit DIS, the sensing latch Ls, the setup circuit SET, and the latch group LG may operate in response to the page buffer control signals PBSIG of FIG. 2. That is, the page buffer control signals PBSIG may be signals for turning on or turning off switches included in all page buffers including the first page buffer PB1.

The bit line precharge circuit PRE may be configured to precharge the first bit line BL1 during the program, read, or erase operation. In the test operation according to the present embodiment, the bit line precharge circuit PRE is deactivated. The bit line precharge circuit PRE may include a first switch S1 configured to supply a power voltage VCC to the first bit line BL1 in response to a bit line precharge signal BL_PRE. The first switch S1 may be implemented with an NMOS transistor. In the test operation according to the present embodiment, since the bit line precharge circuit PRE is deactivated, the bit line precharge signal BL_PRE may be maintained as a low level.

The bit line discharge circuit BDIS may be configured to discharge the first bit line BL1. The bit line discharge circuit BDIS may include a second switch S2 that connects or disconnects the first bit line BL1 and the ground terminal GND to or from each other in response to a bit line discharge signal BL_DIS. The second switch S2 may be implemented with an NMOS transistor that operates in response to the bit line discharge signal BL_DIS.

The bit line select circuit BSEL may include a third switch S3 configured to connect or disconnect the first bit line BL1 and a current sensing node CSO in response to a page sensing signal PBSENSE. The third switch S3 may be implemented with an NMOS transistor that connects or disconnects the first bit line BL1 and the current sensing node CSO to or from each other in response to the page sensing signal PBSENSE The select precharge circuit SEL_PC may be connected between a first node N1 to which the power voltage VCC is supplied and the current sensing node CSO. The select precharge circuit SEL_PC may be configured to connect or disconnect the current sensing node CSO and the sensing node SO to or from each other, or precharge the current sensing node CSO or the sensing node SO. The select precharge circuit SEL_PC may include fourth to ninth switches S4 to S9 connected between the first node N1 and the current sensing node CSO. For example, the fourth and fifth switches S4 and S5 may be connected in parallel to each other between the first node N1 and a second node N2, and the sixth switch S6 may be connected between the second node N2 and the current sensing node CSO. The fourth switch S4 may be implemented with a PMOS transistor that is turned on or turned off in response to an inverted sensing precharge signal SA_PRE_N, and the fifth switch S5 may be implemented with a PMOS transistor that is turned on or turned off according to data stored in a sensing latch node QS. The sixth switch S6 may be implemented with an NMOS transistor that is turned on or turned off in response to a current sensing signal SA_CSOC. The seventh to ninth switches S7 to S9 may be connected in series between the first node N1 and the current sensing node CSO, and may be connected to the fourth to sixth switches S4 to S6 in parallel.

The seventh switch S7 may be implemented with a PMOS transistor that is turned on or turned off according to data stored in the sensing latch node QS. The eighth switch S8 may be implemented with a PMOS transistor that is turned on or turned off in response to the inverted sensing precharge signal SA_PRE_N. The ninth switch S9 may be implemented with an NMOS transistor that is turned on or turned off in response to a sensing signal SA_SENSE. The sensing node SO may be connected between the eighth and ninth switches S8 and S9.

The sensing discharge circuit DIS may be configured to discharge the sensing node SO. The sensing discharge circuit DIS may include tenth and eleventh switches S10 and S11 connected in series between the sensing node SO and a ground terminal GND. The tenth switch S10 may be implemented with an NMOS transistor that is turned on or turned off in response to a sensing discharge signal SA_DIS. The eleventh switch S11 may be implemented with an NMOS transistor that is turned on or turned off according to data stored in the sensing latch node QS. The sensing node SO may be discharged when the sensing discharge signal SA_DIS is logic high and '1' data is stored in the sensing latch node QS.

In the present embodiment, '1' data means a state in which a voltage of the sensing latch node QS is high, and '0' data means a state in which the voltage of the sensing latch node QS is 0V or a negative voltage. Discharge means decreasing a voltage of a node to 0V or a negative voltage, and precharge means increasing the voltage of the node to a positive voltage.

The sensing latch Ls may include first and second inverters I1 and I2 connected between the sensing latch node QS and an inversion sensing latch node QS_N. For example, an input terminal of the first inverter I1 may be connected to the sensing latch node QS, and an output terminal may be connected to the inversion sensing latch node QS_N. An input terminal of the second inverter I2 may be connected to the inversion sensing latch node QS_N, and an output terminal may be connected to the sensing latch node QS. The sensing latch Ls may store sensed data during a sensing operation of the selected memory cell. For example, when the voltage of the first bit line BL1 is determined by the selected memory cell and the first bit line BL1 and the sensing node SO are connected to each other, the voltage of the sensing node SO may be determined. When the voltage of the sensing node SO is determined, data of the sensing latch node QS may be determined by an operation of the setup circuit SET. During the test operation, the test data may be stored in the sensing latch node QS.

The setup circuit SET may be configured to reset the sensing latch Ls or change the data stored in the sensing latch Ls according to the voltage of the sensing node SO. For example, the setup circuit SET may include twelfth and thirteenth switches S12 and S13 connected in series between the sensing latch node QS and the ground terminal GND, and fourteenth and fifteenth switches S14 and S15 connected in series between the inversion sensing latch node QS_N and the ground terminal GND. The twelfth switch S12 may be implemented with an NMOS transistor that is turned on or turned off in response to a latch reset signal LRST. The thirteenth switch S13 may be implemented with an NMOS transistor that is turned on or turned off in response to a page buffer reset signal PBRST. The fourteenth switch S14 may be implemented with an NMOS transistor that is turned on or turned off in response to a latch setup signal LSET. The fifteenth switch S15 may be implemented with an NMOS transistor that is turned on or turned off according to the voltage of the sensing node SO. A common node COM may be connected between the twelfth and thirteenth switches S12 and S13 and between the fourteenth and fifteenth switches S14 and S15, The setup circuit SET may transmit the data stored in the sensing latch Ls to the latch group LG through the common node COM.

The latch group LG may include first to k-th latches L1 to Lk. The first to k-th latches L1 to Lk may temporarily store data used during the program or read operation, and output data received from the setup circuit SET during the read or test operation to a first data line DLI. The first to k-th latches L1 to Lk may exchange data with the sensing node SO. Assuming that the first latch L1 is connected to the setup circuit SET and the k-th latch Lk is connected to the first data line DLI, the test data stored in the sensing latch Ls during the test operation may be transmitted to the first latch L1. The test data transmitted to the first latch L1 may be transmitted to the k-th latch Lk, and the test data transmitted to the k-th latch Lk may be output to the input/output circuit 160 of FIG. 2 through the first data line D1.

Figure 9:
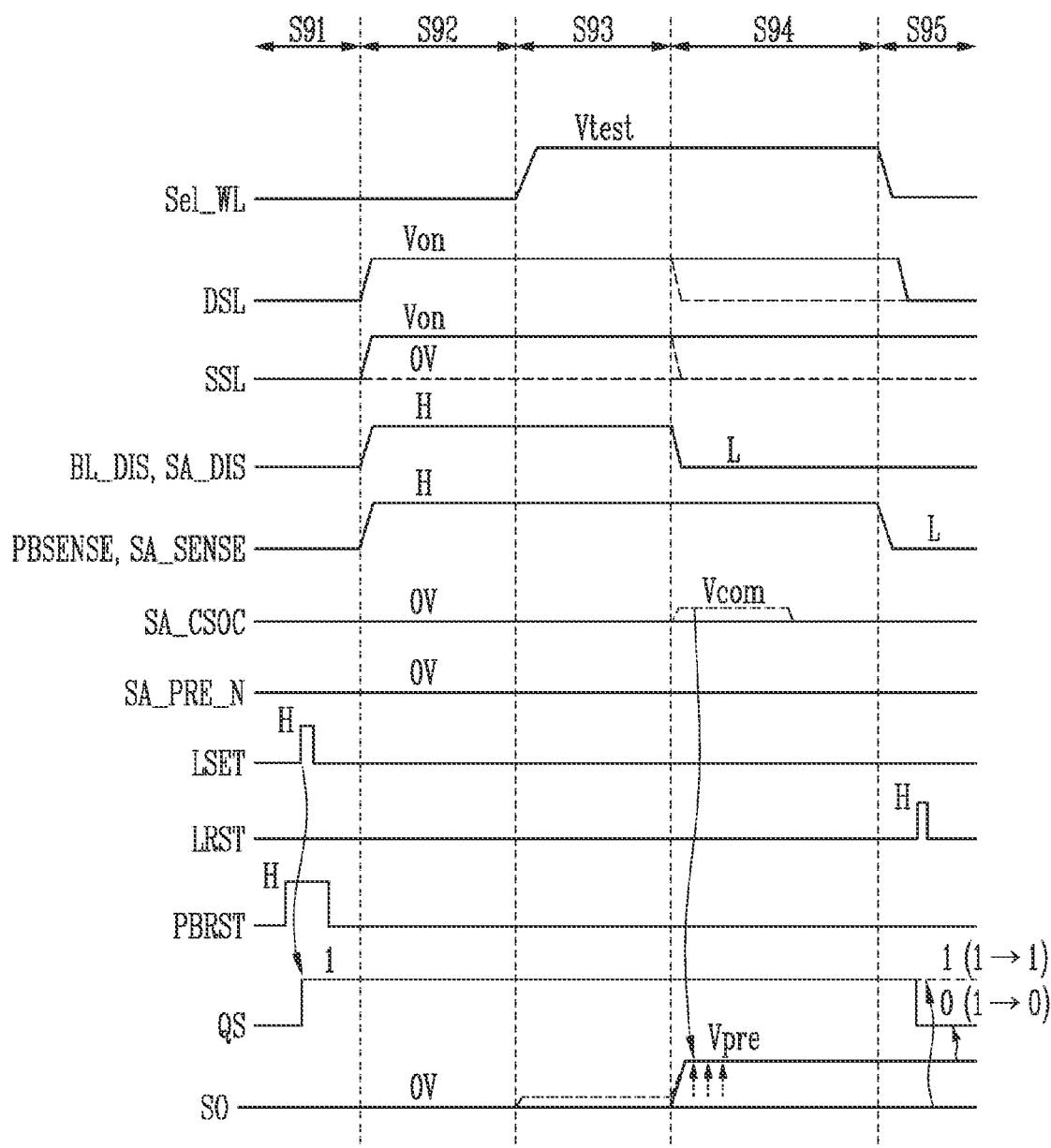
FIG. 9 is a timing diagram illustrating a test operation of a memory device according to a first embodiment of the present disclosure.

FIG. 9 is a taming diagram illustrating a test operation of a memory device according to a first embodiment of the present disclosure.

Referring to FIGS. 8 and 9, the test operation may be performed after the erase operation on the memory cells. The test operation may include a setup step (S91), a discharge step (S92), a test step (S93), an evaluation step (S94), and a sensing step (S95) that are sequentially performed.

The setup step S91 is a step of initializing the sensing latch Ls. For example, in the setup step S91, the '1' data which is the initial data may be stored in the sensing latch node QS of the sensing latch Ls. For example, in a state in which the page buffer reset signal PBRST transits to a logic high H and the thirteenth switch S13 is turned on, the latch setup signal LSET may transit to the logic high H during a predetermined time. When both of the page buffer reset signal PBRST and the latch setup signal LSET have a logic high H value, the thirteenth and fourteenth switches S13 and S14 may be turned on, and thus a current path may be formed between the inversion sensing latch node QS_N and the ground terminal GND. Accordingly, '0' data may be stored in the inversion sensing latch node and data may be stored in the sensing latch node QS. When the data is stored in the sensing latch node QS, the latch setup signal LSET transits to a logic low L, and the page buffer reset signal PBRST also transits to logic low L. The word "predetermined" as used herein with respect to a parameter, such as a predetermined time, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

When the discharge step S92 is started, the sensing discharge signal SA_DIS, the bit line discharge signal BL_DIS, the sensing signal SA_SENSE, and the page sensing signal PBSENSE may transit to the logic high to discharge the sensing node SO, and thus the tenth, second, ninth, and third switches S10, S2, S9, and S3 may be turned on. Accordingly, the sensing node SO and the first bit line BL1 may be connected to the ground terminal GND to be discharged. For example, a voltage of the sensing node SO and the first bit line BL1 may be 0V. In the discharge step S92, a turn-on voltage Von may be applied to the drain and source select lines DSL and SSL of FIG. 4. At this time, a voltage of 0V may be applied to the source line SL of FIG. 4. In the discharge step S92, all word lines may be floated or discharged.

When the test step S93 is started, the test voltage Vtest of the positive voltage may be applied to the selected word line Sel_WL. In the test step S93, even though the test voltage Vtest is applied to the selected word line Sel_WL, since the sensing discharge signal SA_DIS and the bit line discharge signal BL_DIS are maintained high H, the voltage of the sensing node SO may be maintained as a discharge level (for example, 0V) or may be slightly increased by a low level even though the voltage of the sensing node SO is increased to a positive voltage.

When the evaluation step S94 is started, the sensing discharge signal SA DIS and the bit line discharge signal BL_DIS may transit to the logic low L. The turn-on voltage Von may be continuously supplied to the drain select line DSL and the source select line SSL, or 0V which is a turn-off voltage may be applied.

When the sensing discharge signal SA_DIS and the bit line discharge signal BL_DIS transit to the logic low L, since the tenth and second switches S10 and S2 are turned off, a current path between the sensing node SO, first bit line BL1, and the ground terminal GND may be blocked.

When the short defect does not exist between the selected word line Sel_WL, the selected memory cell connected to the selected word line Sel_WL, and the channel formed in the selected memory cell, the voltage of the sensing node SO may be maintained as the discharge level (for example, 0V). When the short defect exists between the selected word line Sel_WL, the selected memory cell connected to the selected word line Sel_WL, and the channel formed in the selected memory cell, a precharge voltage Vpre may be applied to the sensing node SO. Here, the precharge voltage Vpre may be a voltage of the test voltage Vtest applied to the selected word line Sel_WL. For example, when the short defect exists in the selected word line Sel_WL region, the test voltage Vtest applied to the selected word line Sel_WL may be supplied to the first bit line BL1 through the channel of the string. When the voltage of the first bit line BL1 is increased by the test voltage Vtest, the voltage of the sensing node SO connected to the first bit line BL1 may also be increased. Therefore, the precharge voltage Vpre applied to the sensing node SO may have a level of a positive voltage lower than the test voltage Vtest by a threshold voltage of the switches.

At this time, in order to increase a difference between a level of the test voltage Vtest applied to the sensing node SO and the discharge level (for example, 0V), a current sensing signal SA_CSOC having a compensation voltage Vcom may be applied to the sixth switch S6. In other words, the current sensing signal SA_CSOC for weakly turning on the sixth switch S6 may be applied to a gate of the sixth switch S6. When the sixth switch S6 is completely turned on, since the power voltage VCC applied to the second node N2 may be supplied to the current sensing node CSO even though it is not the short defect, the current sensing signal SA_CSOC may have the compensation voltage Vcom lower than the power voltage VCC so that the compensation voltage Vcom lower than the power voltage VCC is transmitted. Since the ninth switch S9 is turned on, when the compensation voltage Vcom is applied to the current sensing node CSO, the precharge voltage Vpre may also be applied to the sensing node SO. Since the fifteenth switch S15 is turned on or turned off by the voltage applied to the sensing node SO, the positive voltage may be set to a level at which the fifteenth switch S15 may maintain a turned-off state. The current sensing signal SA_CSOC having the compensation voltage Vcom may be activated only during a predetermined time in the evaluation step S94 and may be deactivated before the evaluation step S94 is ended.

When the sensing step S95 is started, the selected word line Sel_WL may be discharged. When the turn-on voltage Von is applied to the drain select line DSL until the sensing step S95 starts, the drain select line DSL may also be discharged. The sensing signal SA_SENSE and the page sensing signal PBSENSE may transit to the logical low L.

Subsequently, when the latch reset signal LRST transits to the logic high H, the twelfth switch S12 may be turned on, and thus the sensing latch node QS and the sensing node SO may be connected to each other. When the voltage of the sensing node 50 is 0V or the compensation voltage Vcom, the fifteenth switch S15 is turned off. Therefore, even though the twelfth switch S12 is turned on, the data of the sensing latch node QS may be maintained as '1'. That is, when the test data stored in the sensing latch node QS is the controller 1200 of FIG. 1 may determine that the short defect does not exist between the selected word line Sel_WL and the channel. When the voltage of the sensing node SO is the precharge voltage Vpre, the fifteenth switch S15 is turned on, and thus the data of the sensing latch node QS may be changed from '1' to '0'. That is, when the test data stored in the sensing latch node QS is changed to '0', the controller 1200 of FIG. 1 may determine that the short defect exists between the selected word line Sel_WL and the channel.

Figure 10:
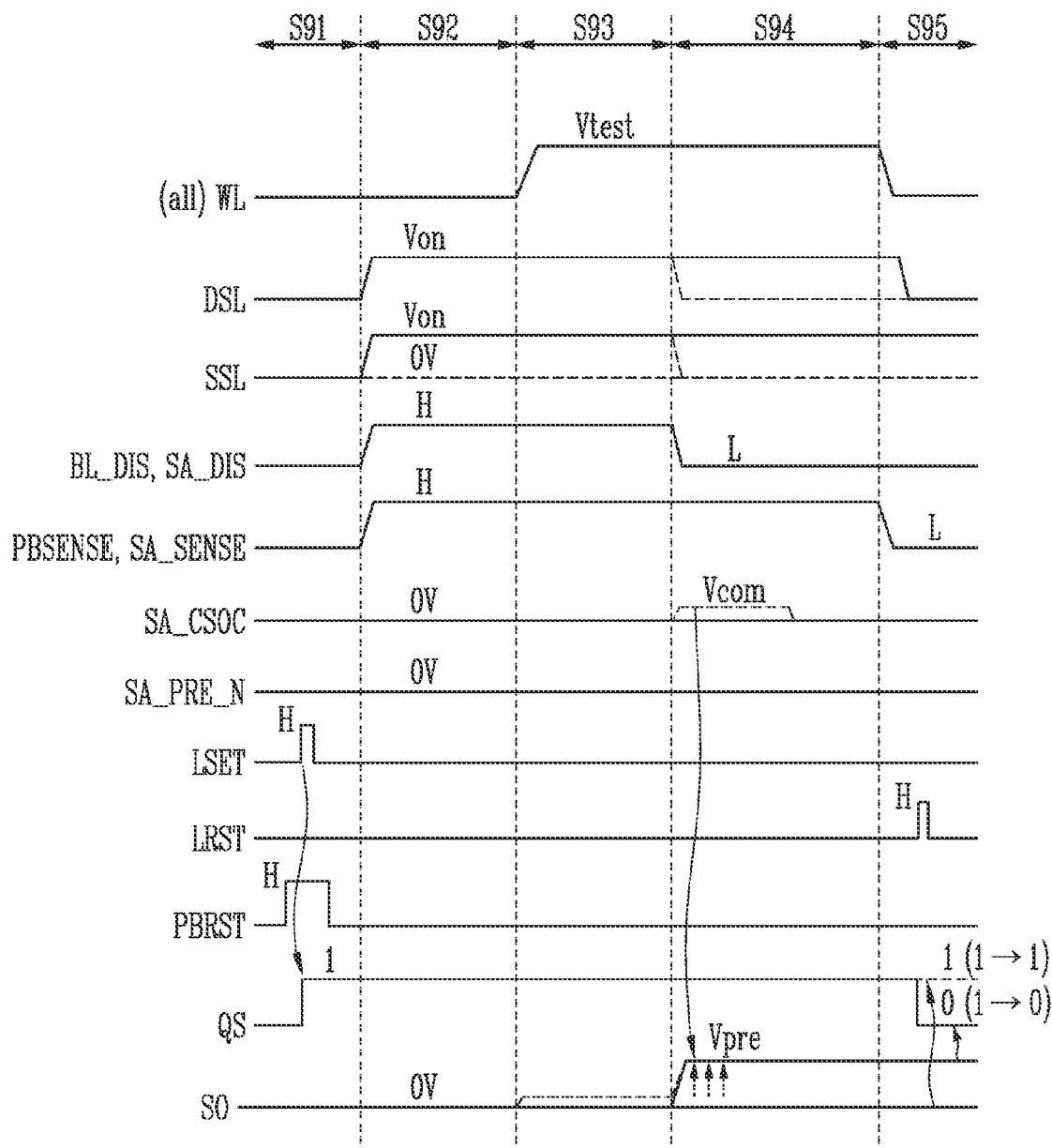
FIG. 10 is a timing diagram illustrating a test operation of a memory device according to a second embodiment of the present disclosure.

FIG. 10 is a timing diagram illustrating a test operation of a memory device according to a second embodiment of the present disclosure.

Referring to FIG. 10, since the test operation according to the second embodiment of the present disclosure is performed similarly to the first embodiment described with reference to FIG. 9, a description of steps repetitive to the first embodiment is omitted.

In the test operation according to the second embodiment, the test voltage Vtest may be simultaneously applied to all word lines WL connected to the selected memory block. For example, in the setup step S91 and the discharge step S92, all word lines WL may be floated or discharged. When the test step S93 is started, the test voltage Vtest may be applied to all word lines WL.

When the test voltage Vtest is applied to all word lines WL as in the second embodiment, a position of the page where the short defect occurs might not be known accurately, but whether the short defect occurs in the selected memory block may be quickly checked.

Figure 11:
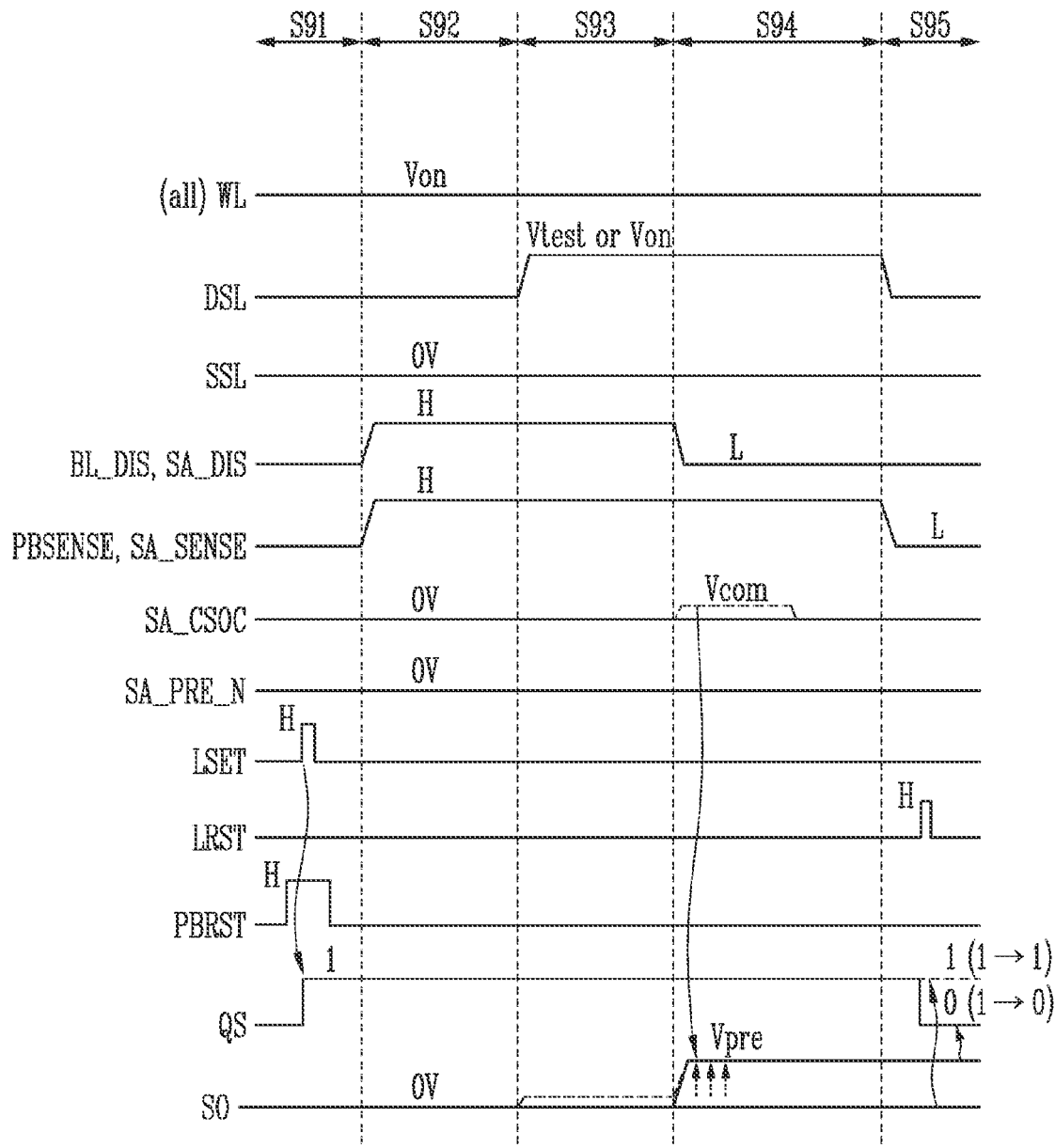
FIG. 11 is a timing diagram illustrating a test operation of a memory device according to a third embodiment of the present disclosure.

FIG. 11 is a timing diagram illustrating a test operation of a memory device according to a third embodiment of the present disclosure.

Referring to FIG. 11, since the test operation according to the third embodiment of the present disclosure is performed similarly to the first embodiment described with reference to FIG. 9, a description of steps repetitive to the first embodiment is omitted.

In the test operation according to the third embodiment, it may be checked whether the short defect exists in a region to which the drain select line DSL is connected. For example, while the test operation is performed, all word lines WL may be floated or discharged, and 0V corresponding to the turn-off voltage may be applied to the source select line SSL. When the test step S93 is started, the test voltage Vtest or the turn-on voltage Von may be applied to the drain select line DSL, and when the sensing step S95 is started, the drain select line DSL may be discharged.

In addition, whether the short defect exists in the region to which the source select line SSL is connected may also be checked by applying the test voltage Vtest or the turn-on voltage Von to the source select line SSL, by applying the third embodiment.

As in the third embodiment, whether the short defect exists may be checked for each line, by applying the test voltage Vtest to a line for checking whether the short detect exists, even though the line is not the word line WL connected to the memory cells.

Figure 12:
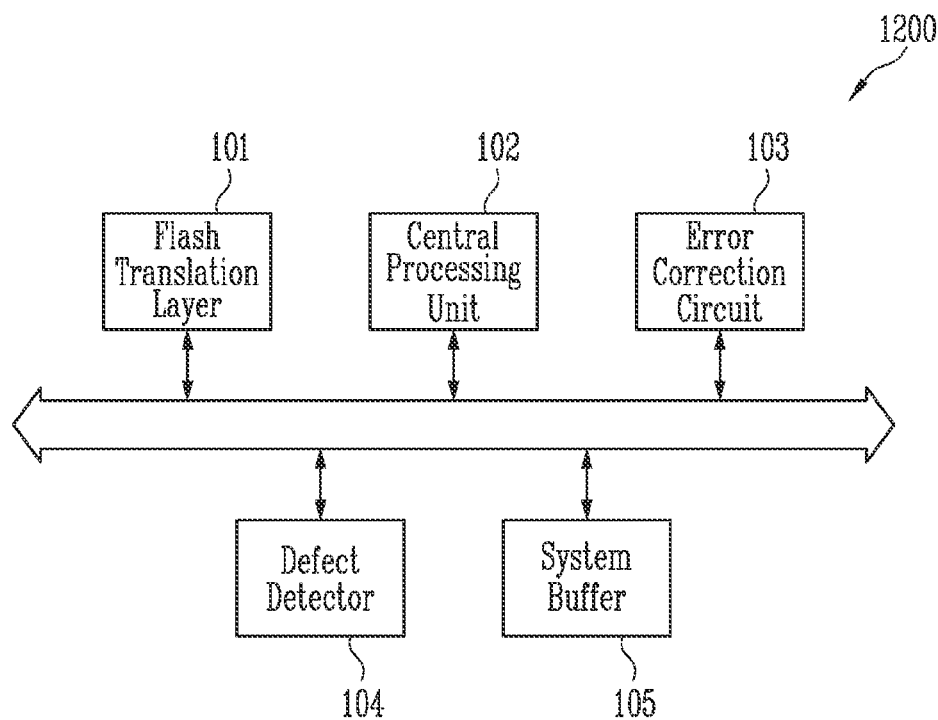
FIG. 12 is a diagram illustrating a controller according to an embodiment of the present disclosure.

FIG. 12 is a diagram illustrating a controller 1200 illustrated in FIG. 1.

Referring to FIG. 12, the controller 1200 may include a flash translation layer 101, a central processing unit 102, an error correction circuit 103, a defect detector 104, and a system buffer 105. In addition, the controller 1200 may further include devices that perform various functions.

The flash translation layer 101 may be configured to map a logical address used in a host and a physical address used in a memory device to each other and manage the mapped addresses.

The central processing unit 102 may be configured to control the flash translation layer 101, the error correction circuit 103, the defect detector 104, and the system buffer 105 included in the controller 1200. For example, the central processing unit 102 may generate a command for controlling the memory device according to a request of the host, and may perform various operations for managing the memory device. For example, the central processing unit 102 may be configured to output the test command CMD_T in order to perform the test operation on the memory device.

The error correction circuit 103 may be configured to detect an error of data read from the memory device during the read operation and correct the detected error.

The defect detector 104 may be configured to receive the test data read from the memory device and determine whether the memory device is defective according to the received test data, during the test operation of the memory device. For example, when '0' data is included in the test data read from the memory device, the defect detector 104 may determine that the short defect exists in the string corresponding to the '0' data.

The system buffer 105 may be configured to store various system data used in the controller 1200. For example, the system buffer 105 may store the address map table generated by the flash translation layer 101 and temporarily store data read from the memory device.

Figure 13:
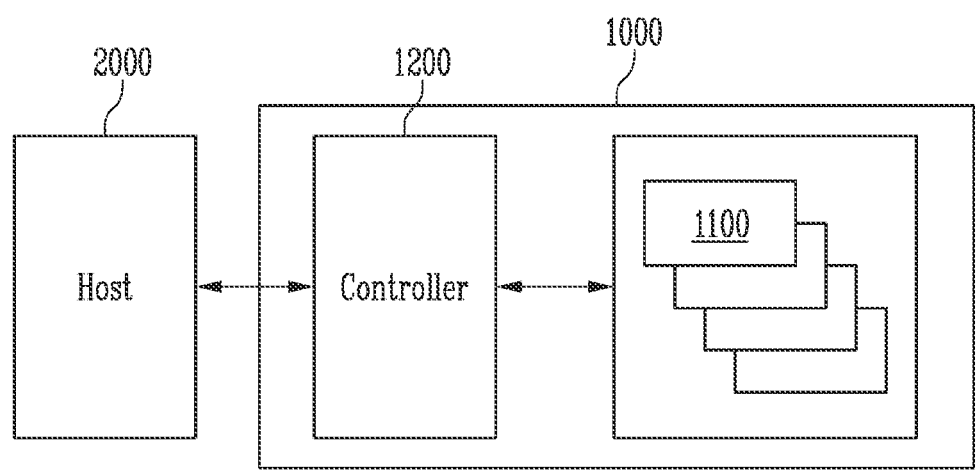
FIG. 13 is a diagram illustrating a memory system including a memory device of the present disclosure.

FIG. 13 is a diagram illustrating a memory system 1000 illustrated in FIG. 1 including memory devices 1100 and controller 1200 of the present disclosure. In an embodiment, the memory devices 1100 and the controller 1200 may be the memory device 1100 and the controller 1200 discussed above with reference to FIG. 1.

Referring to FIG. 13, the memory system 1000 may include the memory device 1100 in which data is stored, and the controller 1200 communicating between the memory device 1100 and the host 2000.

The memory devices 1100 may be configured with the memory device 1100 shown in FIG. 1.

The memory system 1000 may include a plurality of memory devices 1100, and the memory devices 1100 may be connected to the controller 1200 through at least one channel. For example, a plurality of memory devices 1100 may be connected to one channel, and the plurality of memory devices 1100 may be connected to each channel even in a case where a plurality of channels are connected to the controller 1200.

The controller 1200 may communicate between the host 2000 and the memory device 1100. The controller 1200 may control the memory device 1100 according to a request of the host 2000 or may perform a background operation for performance improvement of the memory system 1000 even though there is no request from the host 2000. The host 2000 may generate requests for various operations and output the generated requests to the memory system 1000. For example, the requests may include a program request that may control a program operation, a read request that may control a read operation, an erase request that may control an erase operation, and the like.

The host 2000 may communicate with the memory system 1000 through various interfaces such as peripheral component interconnect express (PCIe), advanced technology attachment (ATA), serial ATA (SATA), parallel ATA (DATA), serial attached SCSI (SAS), non-volatile memory express (NVMe), a universal serial bus (USB), a multimedia card (MMC), an enhanced small disk interface (ESDI), or integrated drive electronics (IDE).

Figure 14:
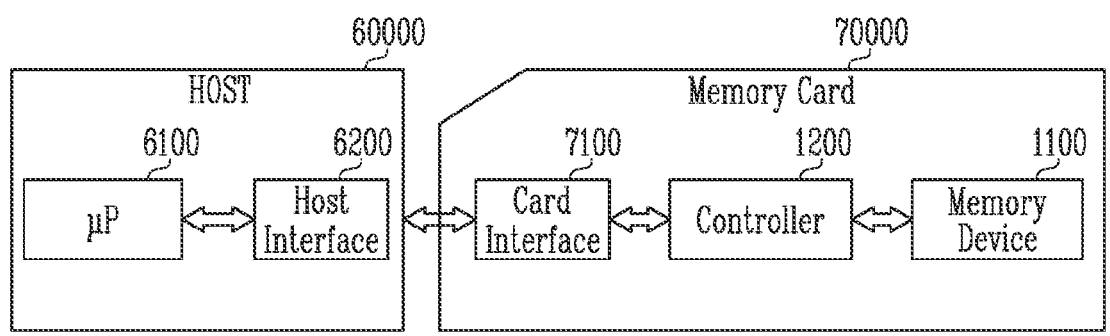
FIG. 14 is a diagram illustrating another memory system including a memory device of the present disclosure.

FIG. 14 is a diagram illustrating another memory system including a memory device of the present disclosure.

Referring to FIG. 14, the memory system 70000 may be implemented as a memory card or a smart card. The memory system 70000 may include the memory device 1100, the controller 1200, and a card interface 7100.

In an embodiment, the memory device 1100 may be configured with the memory device 1100 shown in FIG. 1. In an embodiment, the controller 1200 may be configured with the controller 1200 shown in FIG. 1.

The controller 1200 may control data exchange between the memory device 1100 and the card interface 7100. According to an embodiment, the card interface 7100 may be a secure digital (SD) card interface or a multi-media card (MMC) interface, but is not limited thereto.

The card interface 7100 may interface data exchange between a host 60000 and the controller 1200 according to a protocol of the host 60000, According to an embodiment, the card interface 7100 may support a universal serial bus (USB) protocol, and an inter chip (IC)-USB protocol. Here, the card interface 7100 may refer to hardware capable of supporting a protocol that is used by the host 60000, software installed in the hardware, or a signal transmission method.

When the memory system 70000 is connected to a host interface 6200 of the host 60000 such as a PC, a tablet PC, a digital camera, a digital audio player, a mobile phone, a console video game hardware, or a digital set-top box, the interface 6200 may perform data communication with the memory device 1100 through the card interface 7100 and the controller 1200 under control of a microprocessor (µP) 6100.

What is claimed is:

1. A memory device comprising:
   a memory block connected to word lines and select lines, wherein the word lines are located between the select lines;
   a bit line connected to the memory block;
   a voltage generator configured to generate a test voltage to be applied to a selected line among the word lines and the select lines;
   a page buffer configured to sense a voltage of the bit line to store and output test data; and
   a control logic circuit configured to determine whether a first defect exists in the memory block according to the test data after an erase operation is performed on the memory block, wherein the page buffer comprises:
a sensing latch configured to store the test data determined according to a voltage of a sensing node during a test operation for detecting the first defect of the memory block;
a sensing discharge circuit configured to discharge the sensing node; and
a bit line select circuit configured to block a connection between the sensing node and the bit line, when determining the test data according to the voltage of the sensing node, and
wherein the test data is maintained as reset data in the sensing latch when the test operation is started and the first defect does not exist in the memory block, and is changed when the first defect exists in the memory block.

2. The memory device of claim 1, wherein the voltage generator is configured to generate the test voltage as a positive voltage.

3. The memory device of claim 1, wherein the sensing latch is configured to be reset when the test operation is started.

4. The memory device of claim 3, wherein the sensing discharge circuit is configured to discharge the sensing node when the sensing latch is reset.

5. The memory device of claim 1, wherein the bit line select circuit is configured to connect the bit line and the sensing node to each other while the sensing node is discharged and the test voltage is applied to the selected line, and cut off the connection between the bit line and the sensing node before the test data is determined according to the voltage of the sensing node.

6. The memory device of claim 1, further comprising:
a bit line discharge circuit configured to discharge the bit line simultaneously when the sensing node is discharged.

7. The memory device of claim 1, wherein the first defect is a short defect in which the selected line and a memory cell or a select transistor connected to the selected line are electrically connected to each other.

8. The memory device of claim 7, wherein when the first defect does not exist in the memory block does is a case where a defect does not exist or a second defect different from the first defect exists in the memory block.

9. The memory device of claim 8, wherein the second defect is an open defect in which a portion of a channel of a string including the memory cell and the select transistor is electrically disconnected.

10. A memory system comprising:
a memory device including a page buffer connected to a memory block through bit lines; and
a controller configured to transmit a test command to the memory device and determine whether a defect exists based on test data output from the memory device, during a test operation for detecting the defect of the memory block,
wherein the memory device executes the test operation after an erase operation of the memory block,
the memory device is configured to store initial data in a sensing latch of the page buffer in response to the test command, discharge a sensing node connected between the bit line and the sensing latch, store the test data in the sensing latch according to a voltage of the sensing node changed by the test operation, and output the test data to the controller, and
the controller is configured to determine that a first defect occurs in the memory block when the test data is different from the initial data.

11. The memory system of claim 10, wherein the memory device is configured to transmit a voltage of the bit lines changed by a test voltage to the sensing node which is discharged and store the test data in the sensing latch according to the voltage of the sensing node, after applying the test voltage to a selected line among word lines and select lines connected to the memory block.

12. The memory system of claim 11, wherein the controller comprises:
a central processing unit configured to generate the test command; and
a defect detector configured to detect the first defect according to the test data.

* * * * *